United States Patent
Retz et al.

(10) Patent No.: US 8,324,964 B2
(45) Date of Patent: Dec. 4, 2012

(54) HIGH EFFICIENCY MULTIPLE POWER MODE LINEAR RADIO FREQUENCY POWER AMPLIFIER

(75) Inventors: James M. Retz, Cedar Rapids, IA (US); Ruediger Bauder, Feldkirchen-Westerham (DE)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/013,091

(22) Filed: Jan. 25, 2011

(65) Prior Publication Data

US 2012/0188011 A1   Jul. 26, 2012

(51) Int. Cl.
 *H03F 1/14* (2006.01)
(52) U.S. Cl. ........ 330/51; 330/151; 330/124 R; 330/302
(58) Field of Classification Search .................... 330/51, 330/302, 124 R, 295, 129
See application file for complete search history.

(56) References Cited

U.S. PATENT DOCUMENTS

| | | | |
|---|---|---|---|
| 5,661,434 A | 8/1997 | Brozovich et al. | |
| 6,271,722 B1 | 8/2001 | Ballantyne | |
| 6,496,083 B1 | 12/2002 | Kushitani et al. | |
| 6,900,692 B2 | 5/2005 | Kim et al. | |
| 7,427,894 B2 | 9/2008 | Dow et al. | |
| 2002/0183016 A1 | 12/2002 | Kemmochi et al. | |
| 2005/0079847 A1 | 4/2005 | Arafa | |
| 2005/0280466 A1 | 12/2005 | Gailus et al. | |
| 2006/0223577 A1 | 10/2006 | Ouzillou | |
| 2007/0222523 A1* | 9/2007 | Arell | 330/302 |
| 2008/0139157 A1 | 6/2008 | Kerth et al. | |
| 2009/0017772 A1 | 1/2009 | Kemmochi et al. | |
| 2010/0321129 A1 | 12/2010 | Onody et al. | |

OTHER PUBLICATIONS

"RF3171: Quad Band GMSK Polar Edge TXM, 2 UMTS Switch Ports," RFMD Data Sheet No. 100517, Jun. 16, 2010, pp. 1-26, R.F. Micro Devices, Inc.
"RF3230: Quad-Band GMSK TXM, 2 UMTS Switch Ports," RFMD Data Sheet No. 100406, May 11, 2010, pp. 1-20, R. F. Micro Devices, Inc.
"RF3231: Dual-Band GSM900/DCS1800 Transmit Module with WCDMA Port," RFMD Data Sheet No. 091112, Dec. 3, 2009, pp. 1-16, R.F. Micro Devices, Inc.
Teeter, D.A. et al., "Average current reduction in (W)CDMA power amplifiers," 2006 IEEE Radio Frequency Integrated Circuits Symposium, Jun. 11-13, 2006, 4 pp., IEEE.
Non-final Office Action for U.S. Appl. No. 12/763,659 mailed Sep. 21, 2012, 18 pages.

* cited by examiner

*Primary Examiner* — Hieu Nguyen
(74) *Attorney, Agent, or Firm* — Withrow & Terranova, P.L.L.C.

(57) ABSTRACT

The embodiments disclosed in the detailed description include a power amplifier having a low power mode amplifier, a medium power mode amplifier, and a high power mode amplifier in communication with a radio frequency (RF) output load. The exemplary embodiments of the power amplifier permit a wireless device to select the most power efficient means to transmit an RF signal based upon the desired output power level.

11 Claims, 2 Drawing Sheets

HIGH EFFICIENCY MULTIPLE POWER MODE LINEAR RADIO FREQUENCY POWER AMPLIFIER

RELATED APPLICATIONS

This application is related to U.S. patent application Ser. No. 12/763,659 filed Apr. 20, 2010.

FIELD OF THE DISCLOSURE

The embodiments disclosed herein are related to improving the average current consumption and talk-times of mobile devices. In particular, the embodiments disclosed herein are related to improved average current consumption of linear power amplifiers in mobile devices.

BACKGROUND

Average current consumption and talk-time are important performance metrics for linear power amplifiers used in mobile devices. Some handset manufacturers desire world class average current and talk-time without the use of a DC-DC converter or analog bias control. Thus, there is a need to develop a linear power amplifier that exhibits good average current consumption characteristics, increases the talk-time of a wireless handset, and without the use of a DC-DC converter or analog bias control.

SUMMARY

Embodiments disclosed in the detailed description relate to a power amplifier having a low power mode amplifier, a medium power mode amplifier, and a high power mode amplifier in communication with a radio frequency (RF) output load. Multiple power mode amplifiers address this need by providing multiple modes of operation that provide efficiency benefit for certain power ranges below the maximum output power range. Techniques that can maximize efficiency of the lower power modes of operation without compromising the efficiency of the highest power mode of operation are attractive, and can provide great benefit to the average current consumption and talk time of the wireless handset. The exemplary embodiment of the power amplifier permits a wireless device to select the most power efficient means to transmit an RF signal based upon the desired output power level.

An exemplary embodiment of the power amplifier includes a high power mode output matching network having a first filter node and a second filter node, wherein the second filter node is coupled to a radio frequency output node. A high power mode output stage may be coupled to the first filter node of the high power mode output matching network, where the high power mode output stage has an enable state and a disable state. A medium power mode output stage may include a first input and a first output, the first output in communication with the radio frequency output node, and where the medium power mode output stage has an enable state and a disable state. A low power mode output stage may include a second input and a second output, where the second output may be in communication with the radio frequency output node, and where the low power mode output stage has an enable state and a disable state. The power amplifier may be configured such that in response to the high power mode output stage being in the disable state, the second filter node of the high power mode output matching network may be configured to present a high impedance to the radio frequency output node. Likewise, the power amplifier may be further configured such that in response to the high power mode output stage being in the enable state, the first filter node of the high power mode output matching network is configured to present a substantially power matched impedance to an output of the high power mode output stage.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Embodiments disclosed herein relate to a power amplifier having a low power mode amplifier, a medium power mode amplifier, and a high power mode amplifier in communication with a radio frequency (RF) output load. Multiple power mode amplifiers address this need by providing multiple modes of operation that provide efficiency benefit for certain power ranges below the maximum output power range. Techniques that can maximize efficiency of the lower power modes of operation without compromising the efficiency of the highest power mode of operation are attractive, and can provide great benefit to the average current consumption and talk time of the wireless handset. The exemplary embodiment of the power amplifier permits a wireless device to select the most power efficient means to transmit an RF signal based upon the desired output power level.

An exemplary embodiment of the power amplifier includes a high power mode output matching network having a first filter node and a second filter node, wherein the second filter node is coupled to a radio frequency output node. A high power mode output stage may be coupled to the first filter node of the high power mode output matching network, where the high power mode output stage has an enable state and a disable state. A medium power mode output stage may include a first input and a first output, the first output in communication with the radio frequency output node, and where the medium power mode output stage has an enable state and a disable state. A low power mode output stage may include a second input and a second output, where the second output may be in communication with the radio frequency output node, and where the low power mode output stage has an enable state and a disable state. The power amplifier may be configured such that in response to the high power mode output stage being in the disable state, the second filter node of the high power mode output matching network may be configured to present a high impedance to the radio frequency output node. Likewise, the power amplifier may be further configured such that in response to the high power mode output stage being in the enable state, the first filter node of the high power mode output matching network is configured to present a substantially power matched impedance to an output of the high power mode output stage.

Figure 1:
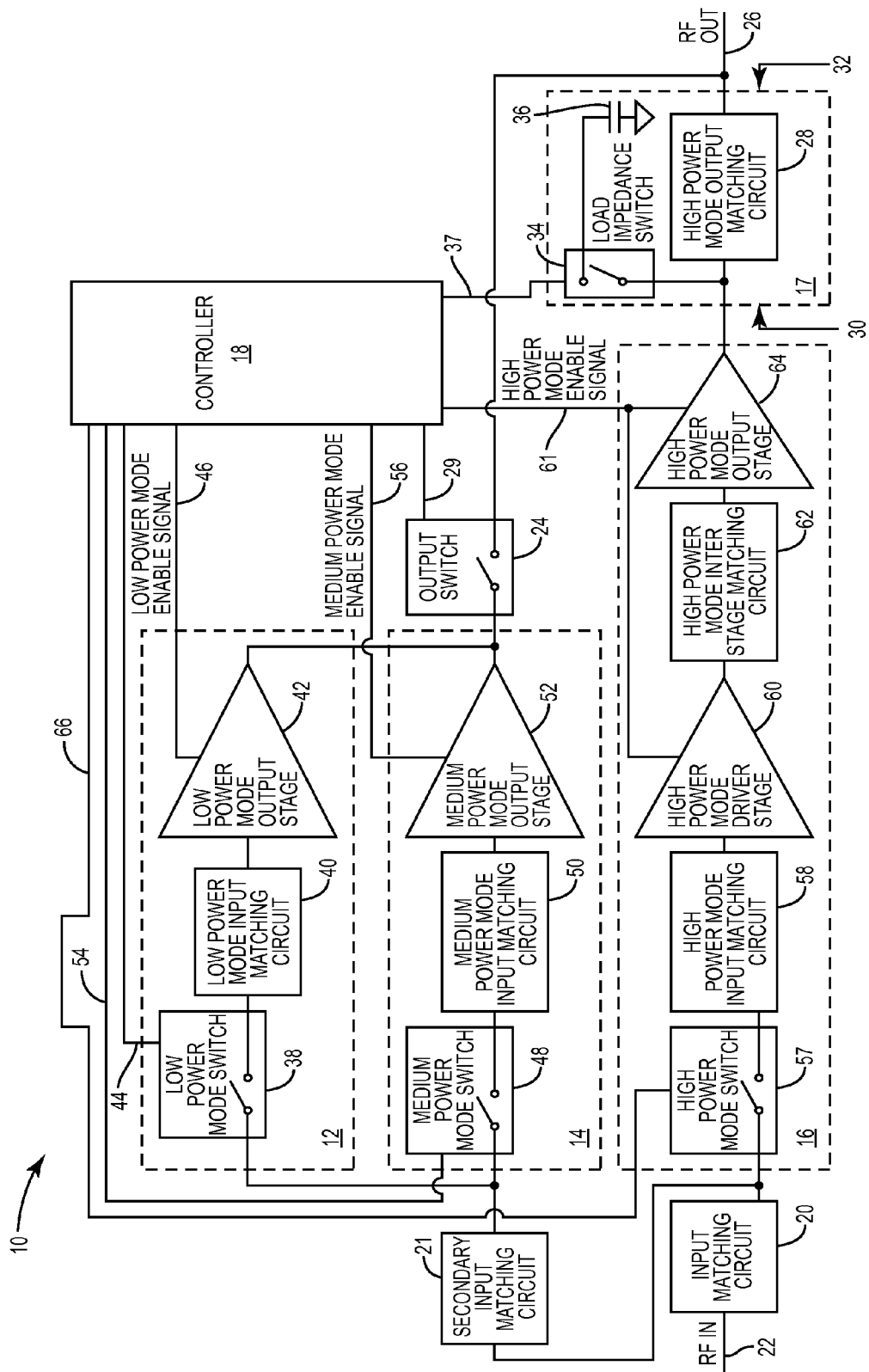
FIG. 1 depicts a first exemplary embodiment of a high efficiency multiple power mode linear RF power amplifier.

With reference to FIG. 1, a radio frequency power amplifier 10 includes a low power mode amplifier 12, a medium power mode amplifier 14, a high power mode amplifier 16, a high power mode output matching network 17, and a controller 18. The controller 18 may be a microprocessor, a microcontroller, a state machine, control logic, a computing mechanism, or a combination thereof. The controller 18 may be in communication with memory or include internal memory to store data and computer program codes to be executed on the controller 18.

The radio frequency power amplifier 10 further includes an input matching circuit 20 and may include a secondary input matching circuit 21. The input matching circuit 20 is configured to receive a radio frequency input 22. The input matching circuit 20 is further configured to provide an output to the respective inputs of the secondary input matching circuit 21 and the high power mode amplifier 16. The output of the secondary input matching circuit 21 is coupled to the inputs of the low power mode amplifier 12 and the medium power mode amplifier 14.

The respective outputs of the low power mode amplifier 12 and the medium power mode amplifier 14 are coupled to the input of an output switch 24. The output of the output switch 24 is coupled to a radio frequency output 26 and the high power mode output matching network 17. The output switch 24 is operatively coupled to the controller 18, which controls the state of the output switch 24 via the output switch control signal 29. The output switch 24 includes an open state and a closed state. The controller 18 places the output switch 24 into an open state when the high power mode amplifier 16 is enabled. The controller 18 places the output switch 24 into a closed state when either the low power mode amplifier 12 or the medium power mode amplifier 14 is enabled.

The high power mode output matching network 17 includes a first filter node 30 coupled to the output of the high power mode amplifier 16. The high power mode output matching network 17 further includes a second filter node 32 coupled to the radio frequency output 26 and the output of the output switch 24. The high power mode output matching network 17 may be configured to present a high impedance to the second filter node 32 when the high power mode amplifier 16 is disabled. The high power mode output matching network 17 may further be configured to present a substantially power matched impedance to the first filter node 30 when the high power mode amplifier 16 is enabled.

As depicted in FIG. 1, the high power mode output matching network 17 includes a high power mode output matching circuit 28 and may include a load impedance switch 34 and a load impedance 36. The inputs of the high power mode output matching circuit 28 and the load impedance switch 34 may be coupled to the first filter node 30. The output of the high power mode output matching circuit 28 may further be coupled to the second filter node 32. The load impedance switch 34 may switchably couple a load impedance 36 to the first filter node 30. The load impedance 36 may be a capacitor. The load impedance switch 34 may be coupled to the controller 18, which controls the state of the load impedance switch 34 via the load impedance switch signal 37. The load impedance switch 34 includes an open state and a closed state. The controller 18 may place the load impedance switch 34 into an open state when the high power mode amplifier 16 is enabled, which permits the high power mode output matching network 17 to present a substantially power matched impedance to the first filter node 30. The controller 18 may place the load impedance switch 34 into a closed state when either the low power mode amplifier 12 or the medium power mode amplifier 14 is enabled. When the load impedance switch 34 is placed into the closed state and the high power mode amplifier 16 is disabled, the parallel combination of the load impedance 36 and the output impedance of the high power mode output stage 64 is transformed by the high power mode output matching circuit 28 to a high impedance load at the second filter node 32 relative to the impedance presented by a load on the radio frequency output 26. As a result, most of the power from either the low power mode amplifier 12 or the medium power mode amplifier 14 is delivered to the impedance presented by the load on the radio frequency output 26.

The low power mode amplifier 12 may include a low power mode switch 38, a low power mode input matching circuit 40, and a low power mode output stage 42. The low power mode switch 38 may be coupled to the output of the secondary input matching circuit 21. The low power mode switch 38 may have an open state and a closed state, which is controlled via the low power mode switch signal 44. The low power mode switch 38 may be configured by the controller 18 to close when the low power mode amplifier 12 is enabled. Otherwise, the controller 18 may be configured to open the low power mode switch 38 when either the medium power mode amplifier 14 or the high power mode amplifier 16 is enabled.

The output of the low power mode switch 38 may also be coupled to the input of the low power mode input matching circuit 40, which provides an output to the low power mode output stage 42. The low power mode output stage 42 may also form the output of the low power mode amplifier 12.

The low power mode output stage 42 may be a linear power amplifier configured to provide power gain to a received radio frequency input. The low power mode output stage 42 may include a low power mode enable signal 46 coupled to the controller 18. The low power mode enable signal 46 may include an enable state and a disable state. When the low power mode amplifier 12 is in the enable state, the controller 18 may assert the enable state of the low power mode enable signal 46. Otherwise, the controller 18 may assert the disable state, which turns off the low power mode output stage 42.

The medium power mode amplifier 14 may include a medium power mode switch 48, a medium power mode input matching circuit 50, and a medium power mode output stage 52. The medium power mode switch 48 may be coupled to the output of the secondary input matching circuit 21. The medium power mode switch 48 may have an open state and a closed state. The medium power mode switch 48 may include a medium power mode switch enable signal 54, which permits the controller 18 to change the operating state of the medium power mode switch 48. The controller 18 may close the medium power mode switch 48 when the medium power mode amplifier 14 is enabled. Otherwise, the controller 18 may be configured to open the medium power mode switch 48 when either the low power mode amplifier 12 or the high power mode amplifier 16 is enabled.

The output of the medium power mode switch 48 may be coupled to the input of the medium power mode input matching circuit 50, which provides an output to the medium power mode output stage 52. The medium power mode output stage 52 may form the output of the medium power mode amplifier 14.

The medium power mode output stage 52 may be a linear power amplifier configured to provide a power gain to a received radio frequency input. The medium power mode output stage 52 may include an input to receive a medium power mode enable signal 56 coupled to the controller 18. The medium power mode enable signal 56 may include an enable state and a disable state. To place the medium power mode amplifier 14 in the enable state, the controller 18 may assert the enable state of the medium power mode enable signal 56. Otherwise, the controller 18 may assert the disable state, which turns off the medium power mode output stage 52.

The high power mode amplifier 16 may include a high power mode switch 57, a high power mode input matching circuit 58, a high power mode driver stage 60, a high power mode interstage matching circuit 62, and a high power mode output stage 64. The high power mode switch 57 may be coupled to the input of the high power mode amplifier 16. The high power mode switch 57 may have an open state and a closed state. The high power mode switch 57 may include a high power mode switch enable signal 66, which permits the controller 18 to change the operating state of the high power mode switch 57. The controller 18 may close the high power mode switch 57 when the high power mode amplifier 16 is enabled. Otherwise, the controller 18 may be configured to open the high power mode switch 57 when either the low power mode amplifier 12 or the medium power mode amplifier 14 is enabled.

The output of the high power mode switch 57 may be coupled to the input of the high power mode input matching circuit 58, which provides an output to the high power mode driver stage 60. The high power mode driver stage 60 may be a linear power amplifier configured to provide a power gain to a received radio frequency input. The high power mode driver stage 60 may include an input to receive a high power mode enable signal 61 coupled to the controller 18. The high power mode enable signal 61 may include an enable state and a disable state. To place the high power mode amplifier 16 in the enable state, the controller 18 may assert the enable state of the high power mode enable signal 61. Otherwise, the controller 18 may assert the disable state, which turns off the high power mode driver stage 60. The output of the high power mode driver stage 60 may be coupled to the high power mode interstage matching circuit 62. The output of the high power mode interstage matching circuit 62 may be coupled to the high power mode output stage 64, which may form the output of the high power mode amplifier 16.

The high power mode output stage 64 may be a linear power amplifier configured to provide high power gain to a received radio frequency input. The high power mode output stage 64 may include a high power mode enable signal 61 coupled to the controller 18. The high power mode enable signal 61 may include an enable state and a disable state. When the high power mode amplifier 16 is in the enable state, the controller 18 may assert the enable state of the high power mode enable signal 61, which turns on the high power mode output stage 64. Otherwise, the controller 18 may assert the disable state, which turns off the high power mode output stage 64. When the high power mode output stage 64 is turned off, or disabled, the high power mode output stage 64 may present a high impedance to the high power mode output matching network 17.

Figure 2:
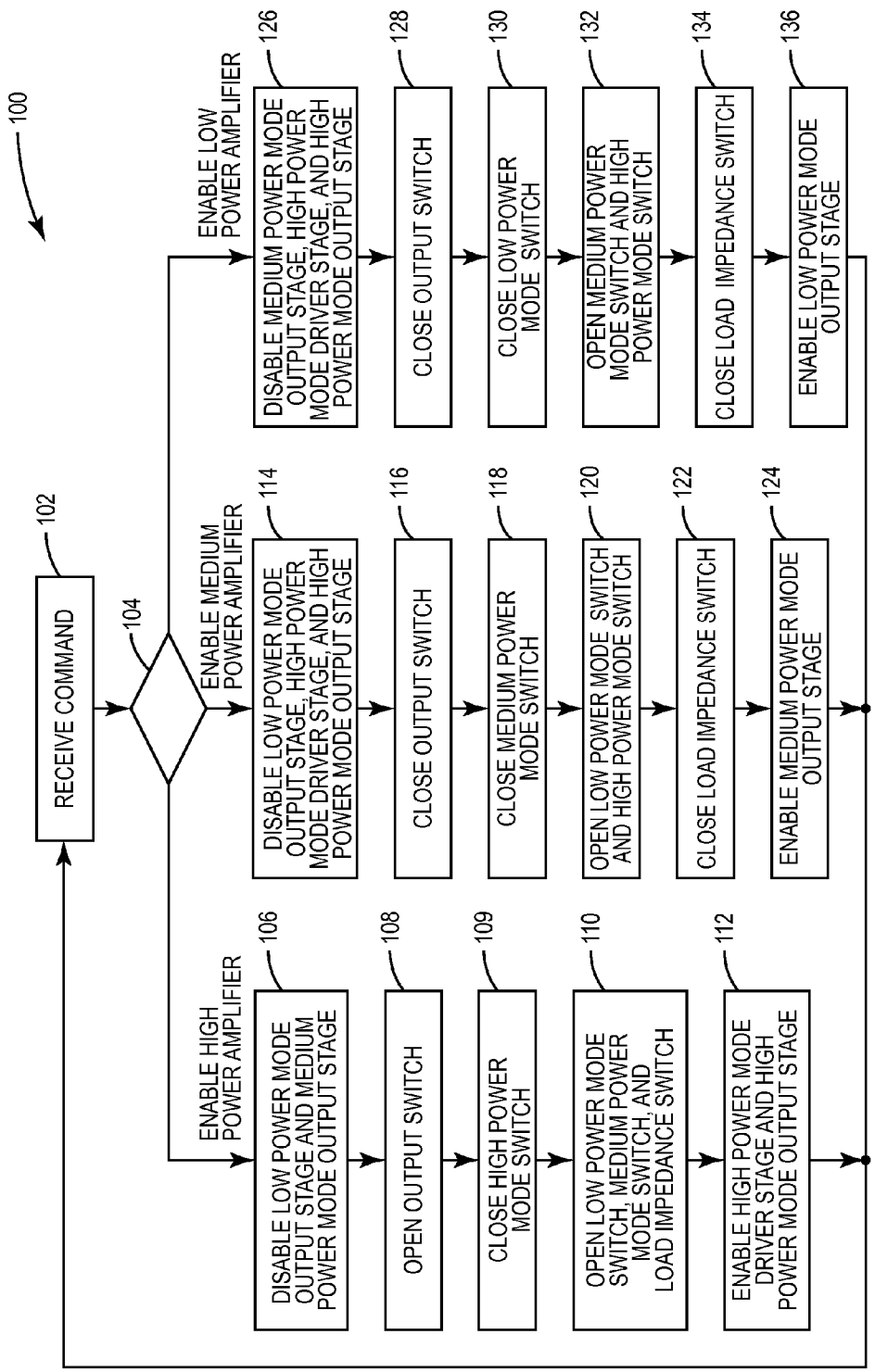
FIG. 2 depicts an operation for controlling the radio frequency power amplifier of FIG. 1.

FIG. 2 depicts an operation 100 for controlling the radio frequency power amplifier 10 with continuing reference to FIG. 1. Upon receipt of a command to control the radio frequency power amplifier 10, (Act 102), the controller 18 determines whether to enable the low power mode amplifier 12, the medium power mode amplifier 14, or the high power mode amplifier 16, (Act 104).

In response to a command to enable the high power mode amplifier 16, the controller 18 disables the low power mode output stage 42 and medium power mode output stage 52, (Act 106.) Thereafter, the controller 18 opens the output switch 24 to disconnect the low power mode output stage 42 and medium power mode output stage 52 from the radio frequency output 26, (Act 108.) If present, the controller 18 closes the high power mode switch 57, (Act 109). If present, the controller 18 also opens the low power mode switch 38, the medium power mode switch 48, and load impedance switch 34, (Act 110.) Thereafter, the controller 18 enables the high power mode driver stage 60 and the high power mode output stage 64, (Act 112.)

In response to a command to enable the medium power mode amplifier 14, the controller 18 disables the low power mode output stage 42, the high power mode driver stage 60, and the high power mode output stage 64, (Act 114.) Thereafter, the controller 18 closes the output switch 24 to connect the medium power mode output stage 52 to the radio frequency output 26, (Act 116.) If present, the controller 18 closes the medium power mode switch 48, (Act 118.) If present, the controller 18 also opens the high power mode switch 57 and the low power mode switch 38, (Act 120.) If present, the controller closes the load impedance switch 34, (Act 122.) Thereafter, the controller 18 enables the medium power mode output stage 52, (Act 124.)

In response to a command to enable the low power mode amplifier 12, the controller 18 disables the medium power mode output stage 52, the high power mode driver stage 60, and the high power mode output stage 64, (Act 126.) Thereafter, the controller 18 closes the output switch 24 to connect the low power mode output stage 42 to the radio frequency output 26, (Act 128.) If present, the controller 18 also closes the low power mode switch 38, (Act 130.) If present, the controller 18 opens the medium power mode switch 48 and the high power mode switch 57, (Act 132). If present, the controller closes the load impedance switch 34, (Act 134.) Thereafter, the controller 18 enables the low power mode output stage 42, (Act 136.)

Those skilled in the art will recognize improvements and modifications to the embodiments of the present disclosure. All such improvements and modifications are considered within the scope of the concepts disclosed herein and the claims that follow.

What is claimed is:

1. A power amplifier comprising:
   a high power mode output matching network having a first filter node and a second filter node, wherein the second filter node is coupled to a radio frequency output node;
   a high power mode output stage coupled to the first filter node of the high power mode output matching network, the high power mode output stage having an enable state and a disable state;
   an output switch having a switch input node and a switch output node coupled directly to the radio frequency output node;
   a medium power mode output stage including a first input and a first output, the first output coupled to the switch input node and through the output switch the medium power mode output stage in communication with the radio frequency output node, the medium power mode output stage having an enable state and a disable state;
   a low power mode output stage including a second input and a second output, the second output coupled to the switch input node and through the output switch the low power mode output stage in communication with the radio frequency output node, the low power mode output stage having an enable state and a disable state;

a controller in communication with the high power mode output stage, the medium power mode output state and the low power mode output state, the controller adapted to:

in response to the high power mode output stage being in the disable state, configure the second filter node of the high power mode output matching network to present a high impedance to the radio frequency output node; and in response to the high power mode output stage being in the enable state, configure the first filter node of the high power mode output matching network to present a substantially power matched impedance to an output of the high power mode output stage.

2. The power amplifier of claim 1 wherein the high power mode output matching network comprises a high power mode output matching circuit, wherein in response to the high power mode output stage being disabled, the controller is further adapted to configure the high power mode output matching circuit to transform an off impedance of the high power mode output stage to present the high impedance to the radio frequency output node.

3. The power amplifier of claim 1 wherein the high power mode output matching network comprises a load impedance switch including an input node coupled to the first filter node of the high power mode output matching network and an output node coupled to a load impedance; and wherein in response to the high power mode output stage being disabled, the controller is further adapted to configure the load impedance switch to close; and wherein in response to the high power mode output stage being enabled, the controller is further adapted to open the load impedance switch.

4. The power amplifier of claim 1 wherein the high power mode output matching network comprises a high power mode output matching circuit, and wherein in response to the high power mode output stage being disabled, the controller is adapted to configure the high power mode output matching circuit to transform a load impedance and an off impedance of the high power mode output stage to present the high impedance to the radio frequency output node.

5. The power amplifier of claim 1 wherein:
the controller is coupled to a low power mode disable input of the low power mode output stage,
the controller is further coupled to a medium power mode disable input of the medium power mode output stage; and
the controller is also coupled to a high power mode disable input of the high power mode output stage.

6. The power amplifier of claim 5 wherein the controller is further configured to disable the low power mode output stage and the medium power mode output stage when the high power mode output stage is enabled.

7. The power amplifier of claim 6 wherein the controller is further configured to open the output switch when the high power mode output stage is enabled.

8. The power amplifier of claim 5 wherein in response to a command to enable the high power mode output stage, the controller is configured to:
disable the low power mode output stage;
disable the medium power mode output stage;
open the output switch to disconnect both the low power mode output stage and the medium power mode output stage from both the second filter node of the high power mode output matching network and the radio frequency output node; and
enable the high power mode output stage.

9. The power amplifier of claim 8 wherein the controller is further configured to open a load impedance switch.

10. The power amplifier of claim 5 wherein in response to a command to enable the medium power mode output stage, the controller is configured to:
disable the low power mode output stage;
enable the medium power mode output stage;
close the output switch to connect both the low power mode output stage and the medium power mode output stage to both the second filter node of the high power mode output matching network and the radio frequency output node; and
disable the high power mode output stage.

11. The power amplifier of claim 5 wherein in response to a command to enable the low power mode output stage, the controller is configured to:
enable the low power mode output stage;
disable the medium power mode output stage;
close the output switch to connect both the low power mode output stage and the medium power mode output stage to both the second filter node of the high power mode output matching network and the radio frequency output node; and
disable the high power mode output stage.

* * * * *